United States Patent

[11] 3,586,930

[72] Inventors Mukunda Behari Das
Thornton Heath;
Richard Downing Josephy, Ham,
Richmond, both of, England
[21] Appl. No. 805,396
[22] Filed Mar. 10, 1969
[45] Patented June 22, 1971
[73] Assignee U. S. Philips Corporation
New York, N.Y.
[32] Priority Mar. 11, 1968
[33] Great Britain
[31] 11844/68

[54] HIGH FREQUENCY, HIGH POWER IGFET WITH INTERDIGITAL ELECTRODES AND PLURAL LOOPED GATE
12 Claims, 4 Drawing Figs.

[52] U.S. Cl. .......... 317/235 R, 317/234 R, 317/234 B, 317/235 G, 317/234 N
[51] Int. Cl. .......... H01l 11/14
[50] Field of Search .......... 317/234/5.4, 235/21.1, 235/22.2

[56] References Cited
UNITED STATES PATENTS

| | | | |
|---|---|---|---|
| 3,484,865 | 12/1969 | Nienhuis .......... | 317/235 |
| 3,307,110 | 2/1967 | Harwood .......... | 325/451 |
| 3,449,645 | 6/1969 | Muller .......... | 317/235 |

*Primary Examiner*—John W. Huckert
*Assistant Examiner*—B. Estrin
*Attorney*—Frank R. Trifari

ABSTRACT: This invention relates to insulated field effect transistors, particularly to insulated gate field effect transistors, suitable for high frequency, high power operation, in which the source and drain regions each comprise a base part and a plurality of finger parts extending therefrom, the source finger parts being interdigitated with the drain finger parts and the current carrying channel region being situated at surface region parts between adjacent source finger parts and drain finger parts, the gate electrode comprising a metal layer pattern having a plurality of limb portions situated above said surface region parts and extending substantially parallel to the longitudinal direction of the source and drain finger parts.

INVENTORS
MUKUNDA B. DAS
RICHARD D. JOSEPHY
BY
Frank R. Trifari
AGENT

INVENTORS
MUKUNDA B. DAS
RICHARD D. JOSEPHY
BY
Frank R. Trifari
AGENT

INVENTORS
MUKUNDA B. DAS
RICHARD D. JOSEPHY
BY
Frank R. Trifari
AGENT

INVENTORS
MUKUNDA B. DAS
RICHARD D. JOSEPHY
BY
Frank R. Trifari
AGENT

HIGH FREQUENCY, HIGH POWER IGFET WITH INTERDIGITAL ELECTRODES AND PLURAL LOOPED GATE

An insulated gate field effect transistor is to be understood to mean herein a high resistivity semiconductor body or body part of one conductivity type, two spaced low resistivity regions of the opposite conductivity type extending in the semiconductor body or body part from one surface thereof, a current carrying channel region in the body or body part situated adjacent the one surface and between the two low resistivity regions in which charge carriers characteristic of the opposite conductivity type can be caused to flow between said two low resistivity regions, a gate electrode at the one surface between the two low resistivity regions and separated from the one surface by insulating material, and electrodes in ohmic contact with the low resistivity regions at the one surface. The two low resistivity regions are referred to as the source and drain regions. The insulated gate field effect transistor may form part of a semiconductor integrated circuit.

One commonly known form of such a transistor is the Metal-Oxide-Semiconductor-Transistor, generally referred to as the MOST. In this device generally the semiconductor body or body part is of silicon and the gate electrode is spaced from the silicon surface by an insulating layer of silicon oxide. In operation the applied voltage between the source and drain regions is such that the PN junction between the source and the adjacent "substrate" of part of the semiconductor body is usually, but not always, unbiased and the PN junction between the drain and the adjacent "substrate" part of the semiconductor body is reverse biased. Current flow between the source and drain is controlled in accordance with the voltage applied to the gate electrode.

Insulated gate field effect transistors have various properties which potentially make them suitable as high frequency power amplifiers, particularly for linear operation and where a high supply voltage is required. For example, a requirement exists for a solid-state device to replace the vacuum tube in the output stages of a single sideband transmitter operating in the 3 to 30 MHz. frequency range. In this application peak envelope output powers of the order of 100 watts are needed with an intermodulation product level of better than −30 db.

In the saturated region of operation the drain current of an insulated gate field effect transistor is given by $$I_D=(\beta/2)V_G^2$$

where $V_G$ is the saturation voltage and approximates in the case of a device formed in high resistivity material to the value of the gate voltage measured from the threshold point, and where the gain factor is determined by $\beta=(\mu_s\, Co\, Z)/l$ where $\mu_s$ is the surface mobility for holes of electrons in P-channel and N-channel devices respectively;

$Co$ is the gate capacitance per unit area; $l$ is the channel length, that is the separation of the source and drain regions; and $Z$ is the channel width.

There are thus three variables, $Co$, $l$ and $Z$, in the device geometry which can be adjusted to obtain a large value of $\beta$, and hence high current capability. As far as $Co$ is concerned the minimum insulating layer thickness which can be used is limited by dielectric breakdown considerations when high voltages, for example 100 volts or more, appear across it. This leaves the channel dimensions $l$ and $Z$ to determine the gain factor. From the point of view of frequency performance, reducing $l$ is preferable to increasing $Z$. However $l$ cannot be reduced to the technological limit in a power device because this would adversely affect the breakdown voltage between source and drain. A value of $l$ of 10 microns has been found to be a reasonable compromise between gain and voltage performance. Given this value of $l$ it is calculated that for a silicon MOST to operate with a peak current of 1 amp at a gate voltage of 10 volts, $\mu_s$ being 150 cm.$^2$/volt second, and $Co$ for a 0.2 micron thick oxide layer being $1.8\times10^{18}$ farads/cm.$^2$, the value of $Z$ must be approximately 5 cms.

Thus a very large channel width is required for large peak currents. One method of achieving this is to define the source and drain regions, which are normally formed by diffusion, such that each is in the form of a comb, the fingers of the source comb being interdigitated with the fingers of the drain comb and the current carrying channel being located at the surface region parts between adjacent interdigitated source and drain fingers. This yields a transistor with a relatively large channel width, said channel having a meander form between the interdigitated source and drain fingers. Problems in the design of such a transistor arise with respect to the geometry and definition of the source, drain and gate electrodes. It is possible to provide a gate electrode metal layer which totally overlies the source and drain fingers and the intermediate surface channel region with the source and drain electrodes being situated on the base portions of the source and drain combs respectively. However such a form is not entirely satisfactory since due to the gate electrode lying over the drain fingers, the gate to drain capacitance is high and this is undesirable since this capacitance gives rise to feedback in circuit operation. Alternatively it is possible to provide a gate electrode metal layer which lies substantially entirely above the surface channel region and also has a meander form. The end of such a gate electrode metal layer comprises a connection portion to which electrical connection, for example in the form of a wire, is made. This form is not always satisfactory for high frequency devices since in the series path between the connection portion and the parts of the gate electrode remote from the connection portion there will be a fairly high resistance. For example, this resistance may be as high as 100 ohms and this is undesirable for high frequency devices because this gate series resistance forms a parasitic time constant with the gate capacitance. Thus in a P-channel MOST with a 10 micron channel length having a cutoff frequency of about 250 MH, with a gate series resistance of only 10 ohms and a gate capacitance of 200 p, there would be a parasitic cutoff frequency of about 80 MH.

According to the invention an insulated gate field effect transistor in which the source and drain regions each comprise a base part and a plurality of finger parts extending therefrom, the source finger parts being interdigitated with the drain finger parts and the current carrying channel region being situated at surface region parts between adjacent source finger parts and drain finger parts, the gate electrode comprising a metal layer pattern having a plurality of limb portions situated above said surface region parts and extending substantially parallel to the longitudinal direction of the source and drain finger parts, is characterized in that said limb portions being joined by a base portion which at least partly overlies one of the source and drain regions and terminates in a connection portion, the electrode in contact with said one region comprising a metal layer pattern having a base portion situated on the base part of said region beyond the base portion of the gate electrode such that current paths from the base portion of the electrode in contact with the one region to the adjacent finger parts of the one region lie in parts of the one region which are situated below the base portion of the gate electrode.

This configuration of an insulated gate field effect transistor provides a device having a relatively low gate series resistance due to the provision of the gate electrode base portion connecting the individual limb portions of the gate electrode. The limb portions of the gate electrode may consist of individual finger portions extending from the base portion of the gate electrode and terminating in the vicinity of a base portion of the electrode in contact with the other of said source and drain regions. However in a preferred form the limb portions of the gate electrode consist of closed loops extending from the base portion of the gate electrode, adjacent loops being joined by said base portion of the gate electrode. This configuration provides a further reduction in the gate series resistance.

In a preferred form of the insulated gate field effect transistor in accordance with the invention the base portion of the gate electrode at least partly overlies the source region. This configuration is preferable to the configuration in which the base portion of the gate electrode at least partly overlies the drain region since in the latter case the gate to drain capacitance would be increased.

In said preferred form in which the base portion of the gate electrode at least partly overlies the source region, the connection portion of the gate electrode may lie above the source region. This situation of the connection portion of the gate electrode is preferable because it does not give rise to an increase in the gate to drain capacity. The gate electrode metal layer pattern may lie wholly within the area bounded by the base portion of the source electrode metal layer pattern.

In the said preferred form in which the base portion of the gate electrode at least partly overlies the source region, the base portion of the gate electrode may lie partly above the channel region parts adjacent the ends of the drain fingers remote from the base part of the drain region and partly above the ends of the source fingers adjacent the base part of the source region. This configuration is preferred to an alternative configuration in which the base portion of the gate electrode lies wholly over the base part of the source region because in the latter case the gate to source capacitance would be higher.

The source electrode metal layer pattern may lie substantially entirely on the base part of the source region, the source region finger parts being free of said metal layer pattern. With this configuration for a given area of the semiconductor body the area of the current carrying channel region may be greater than in a device in which the source electrode metal layer pattern comprises metal layer parts on the source finger parts. In a device in which a smaller channel area can be tolerated for a given area of the semiconductor body the source electrode metal layer pattern may comprise isolated metal layer parts on the source finger parts. Similarly in a device in which it is desired to have a large channel area for a given area of the semiconductor body the drain electrode metal layer pattern lies substantially entirely on the base part of the drain region. Alternatively in a device in which a smaller area for the channel can be tolerated for a give area of the semiconductor body the drain electrode metal layer pattern comprises portions situated on the drain finger parts and extending from a base portion situated on the base part of the drain region.

In an insulated gate field effect transistor in accordance with the invention the semiconductor body or body part may be of silicon and the insulating material separating the gate electrode from the semiconductor surface may comprise silicon oxide. In one preferred form of such a transistor the insulating material comprises a first layer portion of silicon oxide on the semiconductor surface and a second layer portion of silicon nitride situated on the first layer portion.

In one specific insulated gate field effect transistor the limb portions of the gate electrode are laterally offset from the finger parts of the drain region such that the portion of the channel region immediately adjacent the drain fingers does not lie below the gate electrode. Such a device is referred to as an offset gate insulated gate field effect transistor and this configuration may be suitably employed in a high power depletion mode device, particularly a high power depletion mode silicon insulated gate field effect transistor in which the insulating material comprises the previously referred to silicon oxide and silicon nitride layer structure. Such a device is hereinafter referred to a MOST.

Two embodiments of the invention will now be described, by way of example, with reference to FIGS. 1 to 5 of the accompanying diagrammatic drawings, in which.

Figure 1:
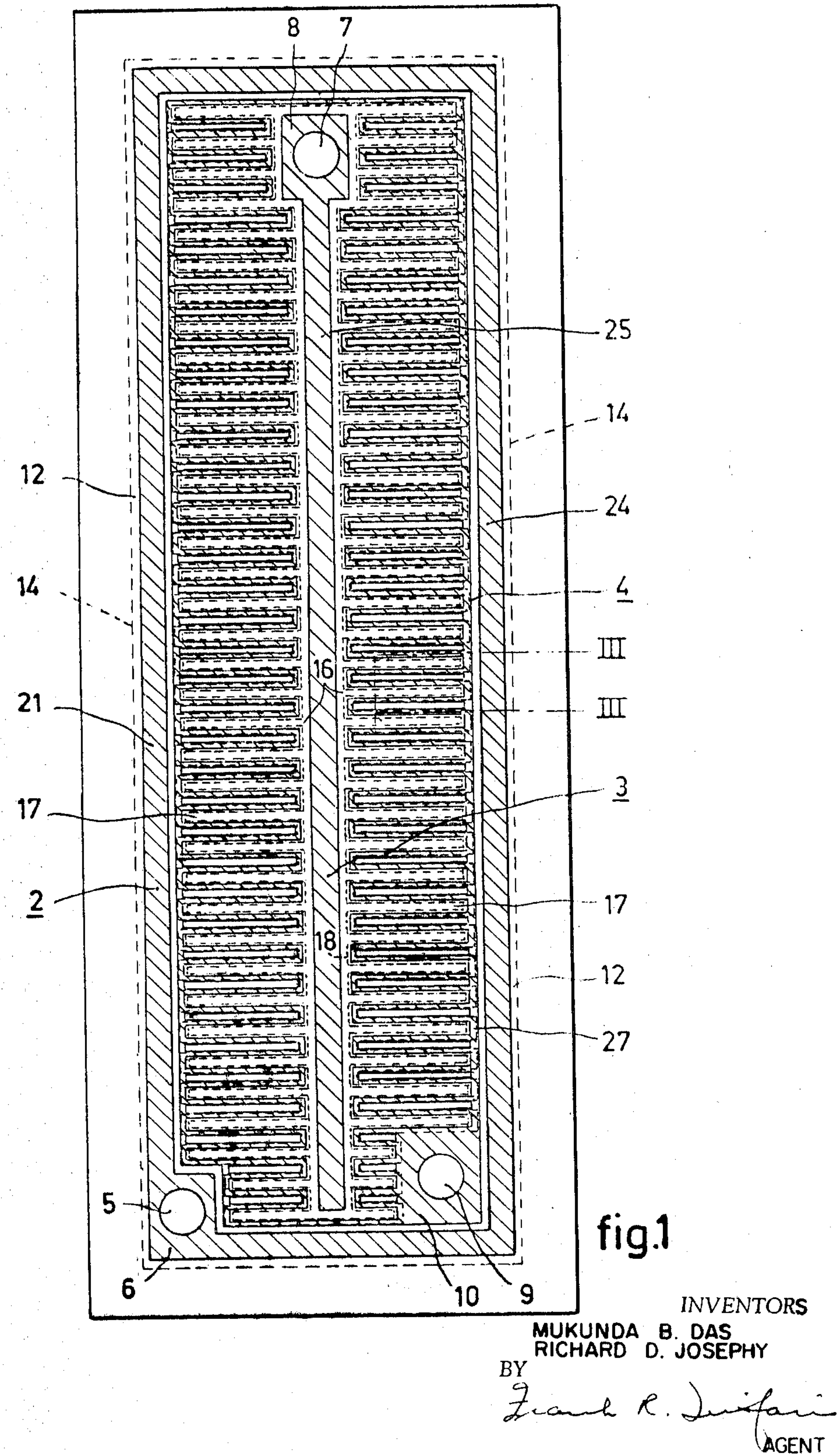
FIG. 1 shows a plan view of a high power depletion mode silicon MOST, accordingly to the invention.
Figure 2:
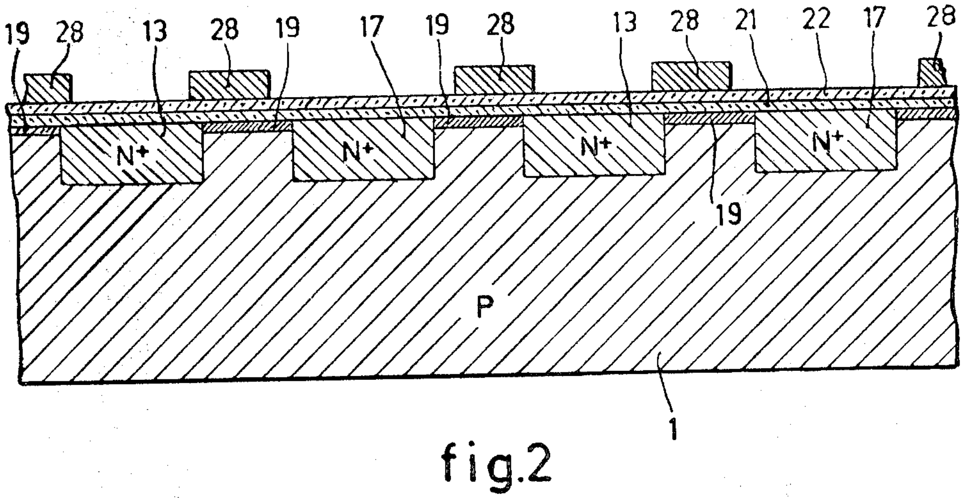
FIG. 2 is a cross section taken along the lines III–III of FIG. 1.
Figure 3:
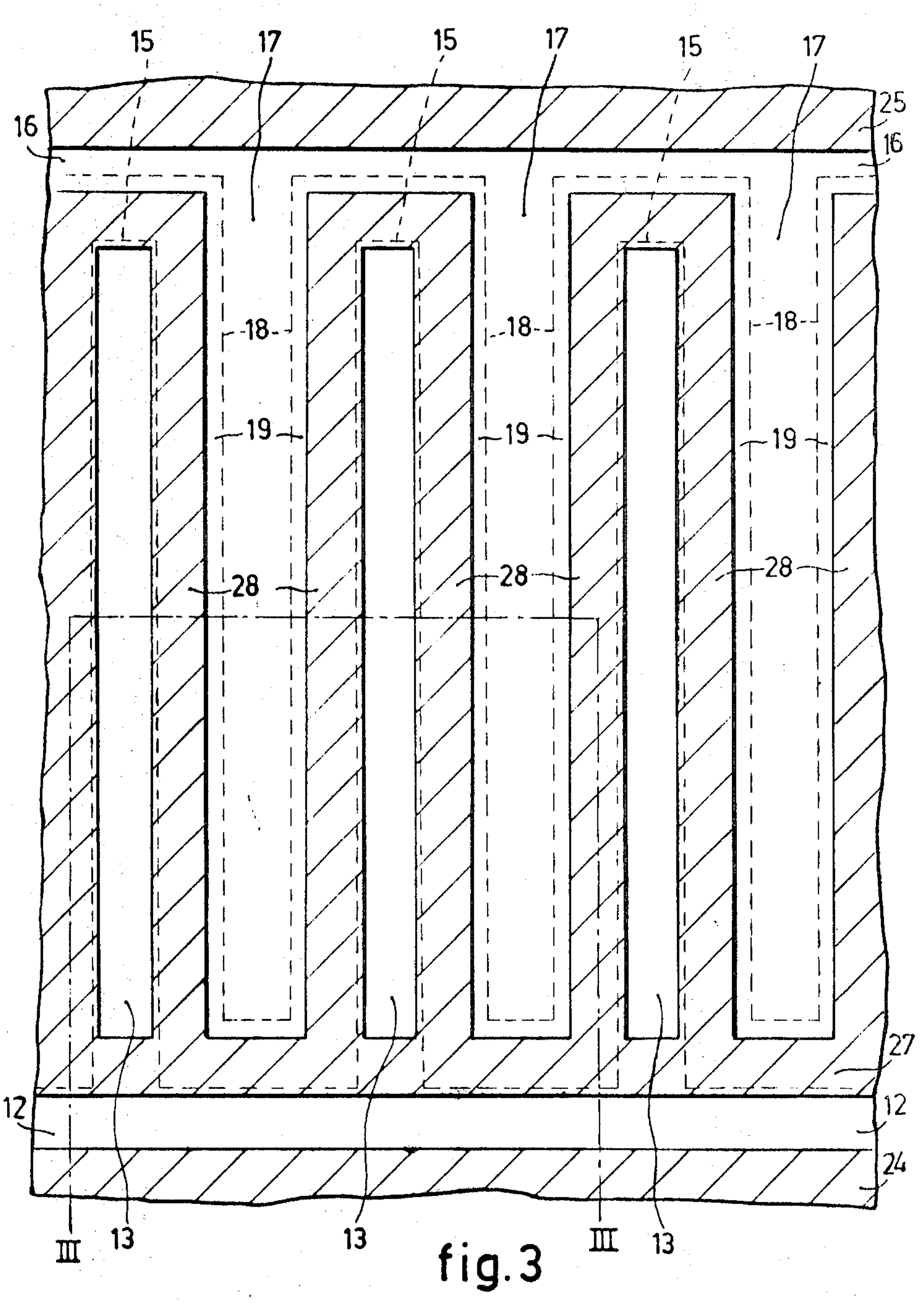
FIG. 3 shows a plan view an enlarged detail of part of the electrode structure of the device shown in FIGS. 1 to 2, metal layer parts being shaded for the sake of clarity.

The higher power silicon MOST shown in FIGS. 1 to 3 comprises a high resistivity P-type silicon body 1 of 2.65 mm. ×1.05 mm. ×250 microns thickness. The source electrode 2 is connected via a wire 5 thermocompression bonded at one end to a large area connection portion 6 on the source electrode of the transistor and at its other end to a terminal on a header part of an envelope on which the semiconductor body is mounted. Similarly the drain electrode 3 is connected to a terminal by a wire 7 thermocompression bonded at one end to the large area connection portion 8 and the gate electrode 4 is connected to a terminal by a wire 9 thermocompression bonded at one end to a large area connection portion 10.

Figure 4:
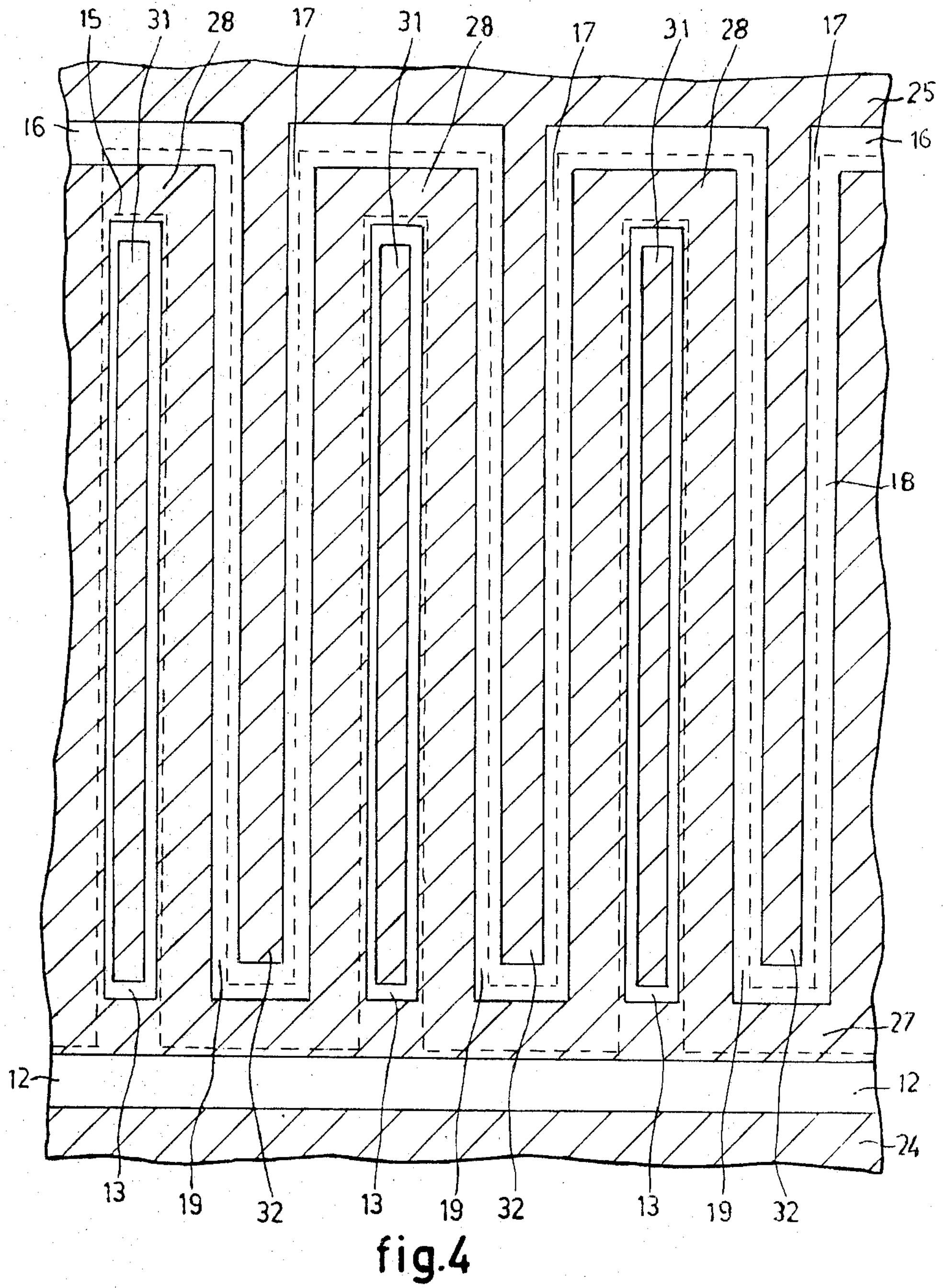
FIG. 4 shows in plan view an enlarged detail of part of the electrode structure of a device which is modification of the device shown in FIGS. 1 to 3.

FIGS. 1 and 4 show the outline of the $N^+$type diffused source and drain regions. The source region comprises a base part 12 having a rectangular outer periphery and a substantially rectangular inner periphery. Extending inwardly from the base part 12 there are a plurality of source region finger parts 13 (see FIGS. 2 and 3). In FIG. 1 the outer periphery of the PN junction between $N^+$type source and the P-type substrate 1 at its termination at the semiconductor body surface is shown by the broken line 14. In FIG. 3 the inner periphery of the PN junction between the $N^+$source region finger parts 13 and the P-type substrate 1 at its termination at the semiconductor body surface is shown by the broken line 15. The drain region comprises a centrally situated base part 16 of rectangular outline. Extending outwardly from the drain region base part 16 there are a plurality of drain region finger parts 17. The source region finger parts 13 are interdigitated with the drain region finger parts 17, said parts each having a width in the direction transverse to their longitudinal direction of approximately 19 microns. In FIGS. 1 and 3 the periphery of the PN junction between the $N^+$drain region finger parts 17 and the P-type substrate 1 at its termination at the semiconductor body surface is shown by the broken line 18. In the semiconductor body between the interdigitated source and drain region finger parts 13 and 17 respectively there is a current carrying channel region 19 having a meander outline. The length of this channel, that is in the direction transverse to the longitudinal direction of the source and drain region finger parts 13 and 17, is 11 microns and the total width of the channel for each sub unit such as is shown in FIG. 1 is 4.08 cm.

On the surface of the semiconductor body there is an insulating layer structure consisting of a first layer part 21 of silicon oxide of 0.1 micron thickness situated on the semiconductor surface and a second layer part 22 of silicon nitride of 0.1 micron thickness situated on the silicon oxide layer part 21 (FIG. 3).

The source and drain electrodes 2 and 3 respectively extend in openings in this composite insulating layer structure and form ohmic contact with surface portions of the source and drain regions respectively as will be described as follows. The source electrode 2 consists of an aluminum layer pattern of 0.4 micron thickness having a base portion 24 situated in an opening in the insulating layer 21, 22 in ohmic contact with the base part 12 of the source region and terminating in the large area connection portion 6 on which the wire 5 is bonded. The drain electrode consists of an aluminum layer pattern of 0.4 micron thickness having a base portion 25 situated in an opening in the insulating layer 21, 22 in ohmic contact with the base part 16 of the drain region and terminating in the large area connection portion 8 on which the wire 7 is bonded.

The gate electrode 4 consists of an aluminum layer pattern of 0.4 micron thickness situated on the surface of the insulating layer part 22 of silicon nitride and comprising a base portion 27 and a plurality of limb portions 28 extending from the base portion 27. The limb portions 28 extend above the channel region part 19 between the interdigitated source and drain finger parts 13 and 17 respectively and form closed loops, adjacent loops being joined by the base portion 27. The dimension of the limb portion 28 in the direction transverse to the longitudinal direction of the source and drain finger parts is 10 microns. The base portion 28 of the gate electrode terminates in the large area connection portion 10 on which the wire 9 is bonded, the connection portion being situated above the base part 12 of the source region.

The base portion 28 of the gate electrode is situated entirely within the source electrode base portion 24 and connects all the loops of the gate electrode formed by adjacent pairs of the gate electrode limb portions 27. It is seen from FIG. 3 that due to the configuration of the gate electrode it does not overlie the drain region at any position and this provides a device having a very low gate to drain capacitance. Furthermore the device has an offset gate geometry in that the limb portions 28 overlap the source finger parts 13 but are offset by 3.0 microns from the drain finger parts 17. In this device the gate series resistance is approximately 6 ohms and the gate to drain capacitance is approximately 5 p.

The current path from the source electrode base portion 24 to the source region finger parts 13 is within areas of the source region underlying the base part 27 of the gate electrode. It is also apparent from FIG. 3 that the gate to source capacitance is minimized by the configuration of the gate electrode in which the major part of the gate electrode base portion 27 lies over the channel and only a smaller part of the portion 27 lies over the ends of the source finger parts 13 adjacent the source region base part 12.

The transistor shown in FIGS. 1 to 3 is a high power depletion mode offset gate MOST, the current carrying channel region consisting of an N-type surface inversion layer formed between the interdigitated source and drain region finger parts 13 and 17 respectively during growth of the silicon oxide layer 21 on the silicon surface.

It will be appreciated that many modifications may be made within the scope of the invention as defined in the appended claims. Thus it is not essential for the insulating layer between the gate electrode and the semiconductor surface to consist of a silicon nitride/silicon oxide layer structure. MOST devices having a single silicon oxide insulating layer of 0.2 microns thickness have been constructed with identical dimensions for the source and drain regions and the electrodes as those described for the MOST of FIGS. 1 to 3. A typical development sample of such a MOST when inserted in a single sideband amplifier test circuit gave a power output of 30 watts peak envelope power at a frequency of 30 MH. Furthermore the invention is not restricted to devices having offset gate electrode geometries. The source and drain electrode geometries may also differ in certain respects. In the structure shown in FIGS. 1 to 3 the geometries of the source, drain and gate electrodes are such that between the interdigitated source and drain region finger parts a large channel area for a given area of the semiconductor body and consequently a large channel length for a given channel area of fixed channel width is obtained. The particular forms of the source and drain electrodes are relevant in that due to the absence of any metallization on the source finger parts and the drain finger parts the dimension of the source and drain finger parts in the direction transverse to their longitudinal direction can be made small. If metal layer portions were to be provided on the source and drain finger parts it would be necessary to increase their dimensions in order to produce a satisfactory device using present state of the art photomasking techniques to define the metal electrode layers.

FIG. 4 shows a modification of the device shown in FIGS. 1 to 2, FIG. 4 corresponding substantially to the view of FIG. 3. In this modified device the source region finger parts 13 have isolated aluminum layer parts 31 on their surface and the drain electrode comprises aluminum layer parts 32 on the surface of the drain region finger parts 17, the aluminum layer parts 32 extending from the drain electrode base portion 25. In this device the channel width and the transverse dimensions of the source and drain region finger parts are of different dimensions because in order to provide and accommodate the aluminum layer parts 31 and 32 the finger parts 13 and 17 must be increased. Such a configuration may be suitable where it is desired to minimize the source and drain series resistances and to enhance the uniformity of the current distribution over all parts of the channel. However for a given area of the device the channel area will be smaller and thus the channel width will be lower for a channel of fixed length.

What we claim is:

1. An insulated gate field effect transistor comprising a semiconductor body portion of one type conductivity having a surface, laterally spaced source and drain regions in the body and adjacent the surface and of the opposite-type conductivity, said source region comprising an elongated source base part and laterally extending therefrom plural source finger parts, said drain region comprising an elongated drain base part on the side of the source adjacent the source fingers and plural drain finger parts laterally extending toward the source base part and interdigitated with the plural source finger parts to define a meandering channel region adjacent the surface and between adjacent source finger and drain finger parts, an insulating layer on the surface, a gate electrode comprising a conductive layer pattern on the insulating layer and comprising a gate base portion and laterally extending therefrom plural gate limb portions, said gate limb portions extending substantially parallel to the longitudinal direction of the source and drain finger parts and lying at least partly over the channel region portions between the source and drain finger parts, said gate base portion extending substantially in the longitudinal direction of and over a part of the base portion of one of the source and drain regions, means for making a connection to the gate electrode, an electrode connection to the source region and comprising a conductive layer on the source base portion at the surface, and on electrode connection to the drain region and comprising a conductive layer on the drain base portion at the surface, said gate base portion extending laterally between the conductive layer constituting the electrode connection to said one of the source and drain regions and the end finger parts of said one region such that the current path from the conductive layer connection to the said one region finger parts extends underneath the gate base position.

2. An insulated gate field effect transistor as set forth in claim 1 wherein adjacent pairs of the gate limb portions are joined together at their ends remote from the gate base portion by a conductive layer to form plural closed loops.

3. An insulated gate field effect transistor as set forth in claim 1 wherein the said one region is the source region whereby the gate base portion at least partly overlies the source region.

4. An insulated gate field effect transistor as set forth in claim 3 wherein the gate connection means lies above the source region.

5. An insulated gate field effect transistor as set forth in claim 3 wherein the gate electrode lies wholly within the area bounded by the conductive layer on the source base portion constituting the source electrical connection.

6. An insulated gate field effect transistor as set forth in claim 3 wherein the gate base portion lies partly above the channel region portions adjacent the drain finger ends and partly above the source finger parts adjacent the source base part.

7. An insulated gate field effect transistor as set forth in claim 3 wherein the source conductive layer connection lies substantially entirely on the source base part, the source finger parts being free of conductive layers.

8. An insulated gate field effect transistor as set forth in claim 3 wherein the source connection comprises insulated conductive layer parts on the source finger parts.

9. An insulated gate field effect transistor as set forth in claim 7 wherein the drain conductive layer connection lies substantially entirely on the drain base part.

10. An insulated gate field effect transistor as set forth in claim 8 wherein the drain conductive layer connection comprises portions on the drain fingers and extending from the part on the drain base.

11. An insulated gate field effect transistor as set forth in claim 1 wherein the semiconductor is silicon, and the insulating layer comprises silicon oxide on the silicon and silicon nitride on the silicon oxide.

12. An insulated gate field effect transistor as set forth in claim 1 wherein the gate limb portions are laterally offset from the drain fingers and thus overlie only the channel portions adjacent the source fingers.